(12) United States Patent
Park et al.

(10) Patent No.: US 7,470,948 B2
(45) Date of Patent: Dec. 30, 2008

(54) MEMORY CELL ARRAY STRUCTURES IN NAND FLASH MEMORY DEVICES

(75) Inventors: Ki-Tae Park, Gyeonggi-do (KR); Jung-Dal Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/617,233

(22) Filed: Dec. 28, 2006

(65) Prior Publication Data

US 2007/0210372 A1 Sep. 13, 2007

(30) Foreign Application Priority Data

Mar. 7, 2006 (KR) .................. 10-2006-0021440

(51) Int. Cl.
*H01L 29/76* (2006.01)
(52) U.S. Cl. .................. 257/314; 257/315; 257/318; 438/247; 438/258
(58) Field of Classification Search .................. 257/314, 257/315, 318, 319; 438/247, 258
See application file for complete search history.

(56) References Cited

U.S. PATENT DOCUMENTS

| | | | |
|---|---|---|---|
| 6,376,876 B1 * | 4/2002 | Shin et al. ................. | 257/315 |
| 7,259,421 B2 * | 8/2007 | Hur et al. ................. | 257/315 |
| 2004/0135194 A1 | 7/2004 | Lee | |
| 2004/0188753 A1 * | 9/2004 | Kawashima et al. ........ | 257/316 |
| 2006/0017094 A1 * | 1/2006 | Kim et al. ................. | 257/315 |
| 2006/0081945 A1 * | 4/2006 | Lee et al. ................. | 257/390 |

FOREIGN PATENT DOCUMENTS

| | | |
|---|---|---|
| JP | 08-032215 | 2/1996 |
| JP | 10-209406 | 8/1998 |
| JP | 10-261774 | 9/1998 |
| JP | 2004-221589 | 8/2004 |
| KR | 1020020062431 A | 7/2002 |
| KR | 1020030055871 A | 7/2003 |
| KR | 1020040064339 A | 7/2004 |
| KR | 1020040079057 A | 9/2004 |

OTHER PUBLICATIONS

Notice to File a Response/Amendment to the Examination Report corresponding to Korean Patent Application No. 10-2006-0021440 mailed Apr. 24, 2007.
Notice of Allowance corresponding to Korean Patent Application No. 10-2006-0021440 mailed Apr. 8, 2008.

* cited by examiner

*Primary Examiner*—Phuc T Dang
(74) *Attorney, Agent, or Firm*—Myers Bigel Sibley & Sajovec, PA

(57) ABSTRACT

A NAND-type non-volatile semiconductor memory device includes a gate insulating layer on an active region of a semiconductor substrate, first and second select gate structures on the active region, and a memory gate structure therebetween. The first and second select gate structures respectively include a plurality of select gate patterns, and the memory gate structure includes a plurality of storage gate patterns. The gate insulating layer includes a plurality of openings therein exposing portions of the active region between ones of the plurality of select gate patterns of the first and second select gate structures. The device may further include impurity regions in portions of the active region between the gate patterns, and halo regions adjacent ones of the impurity regions in the portions of the active region exposed by the openings in the gate insulating layer. Related fabrication methods are also discussed.

42 Claims, 15 Drawing Sheets

US 7,470,948 B2

MEMORY CELL ARRAY STRUCTURES IN NAND FLASH MEMORY DEVICES

CROSS-REFERENCE TO RELATED APPLICATIONS

This U.S. non-provisional patent application claims priority under 35 U.S.C. § 119 from Korean Patent Application No. 10-2006-0021440, filed on Mar. 7, 2006, the disclosure of which is hereby incorporated by reference herein in its entirety.

BACKGROUND OF THE INVENTION

The present invention disclosed herein relates to semiconductor devices, and more particularly, to flash memory devices and related fabrication methods.

A flash memory device is one type of nonvolatile memory device that may be capable of retaining stored data regardless of the presence of power supply, and may be configured to electrically change the stored data more easily than other nonvolatile memory devices, such as a read only memory (ROM) devices.

The flash memory device may be classified into two types according to the kind of a structure for storing charges, of which one is a floating gate type flash memory and the other one is a charge trap type flash memory. In more detail, the floating gate flash memory, may store the charges in a floating gate electrode disposed under a control gate electrode. However, since the conductive floating gate electrode should be electrically isolated for data retention, the manufacturing process for the floating gate type flash memory may be more complicated in comparison with that of the charge trap type flash memory. In addition, a gate structure of the floating gate type flash memory may have a relatively high aspect ratio, which may result in technical difficulties in follow-up processes.

In contrast, because the charge trap type flash memory may use a gate insulating layer formed of a material having sufficient trap sites therein, e.g., silicon nitride, it may have a similar structure to a conventional metal oxide semiconductor field effect transistor (MOSFET). Accordingly, the manufacturing process for the charge trap type flash memory may be simpler and easy in comparison with the floating gate type flash memory. For this reason, various research has been performed regarding the commercial feasibility of the charge type trap type flash memory.

Meanwhile, the flash memory device may be classified into a NOR type structure or a NAND type structure based on how memory cells are connected to a bit line and a source line. In detail, the NOR type flash memory device (hereinafter referred to as a NOR flash) may be configured such that respective memory cells are connected to the bit line and the source line in parallel, and thus may have relatively speedy random access. Therefore, the NOR flash may be mainly used in basic input output systems (BIOS), cellular phones, personal digital assistants (PDA), and so forth.

In contrast, the NAND type flash memory device (hereinafter referred to as a NAND flash) may be configured such that memory cells are connected to a bit line $BL_{0-n}$ and a common source line CSL in series (see FIG. 1). As shown in FIG. 1, a cell array of the NAND flash includes a plurality of cell strings 5, and each of the cell strings 5 has a plurality of memory cells connected to each other in series. Herein, respective gate electrodes of the memory cells are connected to respective different word lines $WL_0 \sim WL_m$. Furthermore, ground selection transistors (connected to each other by a ground selection line GSL) and string selection transistors (connected to each other by a string selection line SSL) are disposed at both ends of the cell strings 5, so as to control electrical connection between the memory cells and the bit line $BL_0 \sim BL_n$/the common source line CSL.

Due to the serial connection structure of the NAND flash, the NAND flash may have a high degree of integration among existing semiconductor devices. In addition, since the NAND flash may adopt an operation scheme that simultaneously changes data stored in the plurality of memory cells, the update speed of data may be faster than the NOR flash. Because of high integration and rapid update speed, the NAND flash may be mainly used in portable electronic devices requiring a mass storage device such as digital cameras, MP3 players, or the like. The IDC, a market research firm, forecasts that the market of the NAND flash product will be expanded more and more due to increasing demand for portable electronic devices.

FIG. 2 is a cross-sectional view illustrating a portion of a cell array of a conventional charge trap type NAND flash memory device.

Referring to FIG. 2, gates 30 crossing over active regions are disposed on a semiconductor substrate 10, and impurity regions 70 are disposed on the active region between the gates 30. The gates 30 are used as the word lines $WL_0 \sim WL_n$, the string selection lines SSL, and the ground selection lines GSL. The impurity region 70S disposed at one side of the ground selection line GSL is connected to a common source line CSL through a first plug 51, and the impurity region 70D disposed at one side of the string selection line SSL is connected to a bit line BL through a second plug 52.

In addition, halo regions 80 and 82 are formed around the lower portion of the impurity region 70. The halo regions 80 and 82 may be formed through an ion implantation process using the gates 30 as masks. However, according to the conventional charge trap type flash memory, a space D2 between the ground selection line GSL and the word line $WL_0$ adjacent thereto and a space D2 between the string selection line SSL and the word line $WL_m$ adjacent thereto are greater than a space D1 between two adjacent word lines, e.g., between the word lines $WL_0$ and $WL_1$. This space difference may cause the amount of impurity ions implanted onto the active region to be different. In addition, this problem may become more serious in a tilt ion implantation process. Therefore, the halo region 80 at one side of the outermost word line $WL_0$ and $WL_m$ may have a different impurity concentration than the halo region 82 at the other side thereof.

The difference in the impurity concentrations may cause the operational characteristics (particularly, the difference in the threshold voltage distribution of an erased cell) of the outermost word lines $WL_0$ and $WL_m$ to be different from the operational characteristics of the inner word lines $WL_1 \sim WL_{m-1}$, as illustrated in FIG. 3. Also, the same problems in the operational characteristic differences between the outermost word lines and the inner word lines may occur in the floating gate type NAND flash memory.

SUMMARY OF THE INVENTION

Some embodiments of the present invention may provide NAND flash memory devices having a plurality of selection lines and an outer halo region formed therebetween. The devices may include an active region disposed on a predetermined region of a semiconductor substrate having an inner region and an outer region; a memory gate structure having a plurality of word lines crossing over the active region, the memory gate structure being disposed in the inner region; a select gate structure having a plurality of string selection lines and a plurality of ground selection lines crossing over the active region, wherein the plurality of string selection lines and the plurality of ground selection lines are disposed at one side and the other side of the memory gate structure, respectively; and an impurity region formed in the active region between the word lines, between the string selection lines, between the ground selection lines, between the string selection line and the adjacent word line, and between the ground selection line and the adjacent word line. The string and ground selection lines immediately adjacent to the memory gate structure may be disposed on an interface between the inner region and the outer region, and outer halo regions may be additionally disposed around and/or adjacent the lower portions of the impurity regions of the outer region.

In some embodiments, a charge-storing pattern may be additionally disposed under the memory and select gate structures and covers a predetermined region of the active region. The charge-storing pattern may cover a surface of the active region of the inner region, but may expose portions of the active region between the string selection lines and portions of the active region between the ground selection lines. The outer halo regions may bee formed in the portions of the active region that is uncovered by the charge-storing pattern between the string selection lines and between the ground selection lines.

In other embodiments, the string selection line may include an outer string selection line disposed at one side of the memory gate structure, and an inner string selection line disposed between the outer string selection line and the memory gate structure. In addition, the ground selection line may include an outer ground selection line disposed at the other side of the memory gate structure, and an inner ground selection line disposed between the outer ground selection line and the memory gate structure. The inner string and ground selection lines may be disposed on the interface between the inner region and the outer region. Furthermore, linewidths of the inner string and ground selection lines may be greater than or equal to a linewidth of the word line.

In still other embodiments, at least one intermediate string selection line may be additionally disposed between the inner and outer string selection lines, and at least one intermediate ground selection line may be additionally disposed between the inner and outer ground selection lines. Spaces between the string selection lines, between the ground selection lines, between the string selection line and the adjacent word line, and between the ground selection line and the adjacent word line, may be substantially equal to or greater than an intra-distance between the word lines.

In even other embodiments, an inner halo region having the same conductivity type as the outer halo region may be additionally disposed around the lower portion of the impurity region of the inner region. An impurity concentration may be lower in the inner halo region than the outer halo region.

In yet other embodiments, the outer halo region may be formed in the outer region. As a result, the active regions at either side of each of the string and ground selection lines disposed on the interface between the inner region and the outer region may have asymmetric impurity concentration distributions.

According to further embodiments of the present invention, a NAND-type non-volatile semiconductor memory device includes a semiconductor substrate including an active region therein, a gate insulating layer on the active region of the substrate, first and second select gate structures respectively comprising a plurality of select gate patterns on the active region of the substrate, and a memory gate structure comprising a plurality of storage gate patterns on the active region of the substrate between the first and second select gate structures. The gate insulating layer covers portions of the active region between ones of the plurality of storage gate patterns of the memory gate structure and includes a plurality of openings therein exposing portions of the active region between ones of the plurality of select gate patterns of the first and second select gate structures.

In some embodiments, a plurality of impurity regions may be in portions of the active region between ones of the plurality of storage gate patterns of the memory gate structure, between the ones of the plurality of select gate patterns of the first and second select gate structures, and between the memory gate structure and the first and second select gate structures. Also, a plurality of halo regions may be adjacent ones of the plurality of impurity regions in the portions of the active region exposed by the openings in the gate insulating layer between the ones of the plurality of select gate patterns of the first and second select gate structures.

In other embodiments, portions of the active region immediately adjacent to outermost ones of the plurality of storage gate patterns on opposite sides thereof may have substantially similar impurity concentration distributions.

In some embodiments, the first and second select gate structures may respectively include an outer select gate pattern and an inner select gate pattern immediately adjacent to an outermost one of the plurality of storage gate patterns. Portions of the active region immediately adjacent to the inner select gate pattern on opposing sides thereof may have asymmetric impurity concentration distributions.

According to still further embodiments of the present invention, a method of forming a NAND-type non-volatile semiconductor memory device on an active region of a semiconductor substrate includes forming a gate insulating layer on the active region of the substrate, forming first and second select gate structures respectively comprising a plurality of select gate patterns on the active region of the substrate, and forming a memory gate structure comprising a plurality of storage gate patterns on the active region of the substrate between the first and second select gate structures. A plurality of openings are formed in the gate insulating layer such that the gate insulating layer covers portions of the active region between ones of the plurality of storage gate patterns of the memory gate structure and exposes portions of the active region between ones of the plurality of select gate patterns of the first and second select gate structures.

In some embodiments, a plurality of impurity regions may be formed in portions of the active region between ones of the plurality of storage gate patterns of the memory gate structure, between the ones of the plurality of select gate patterns of the first and second select gate structures, and between the memory gate structure and the first and second select gate structures using the plurality of storage gate patterns and the plurality of select gate patterns as masks. Also, a plurality of halo regions may be formed adjacent ones of the plurality of impurity regions in the portions of the active region exposed by the openings in the gate insulating layer between the ones of the plurality of select gate patterns of the first and second select gate structures.

In other embodiments, the plurality of halo regions may be formed by forming a photoresist pattern on the plurality of storage gate patterns of the memory gate structure, and implanting ions into the portions of the active region exposed by the openings in the gate insulating layer using the photoresist pattern as a mask to form the plurality of halo regions therein.

DETAILED DESCRIPTION OF EMBODIMENTS OF THE INVENTION

Figure 1:
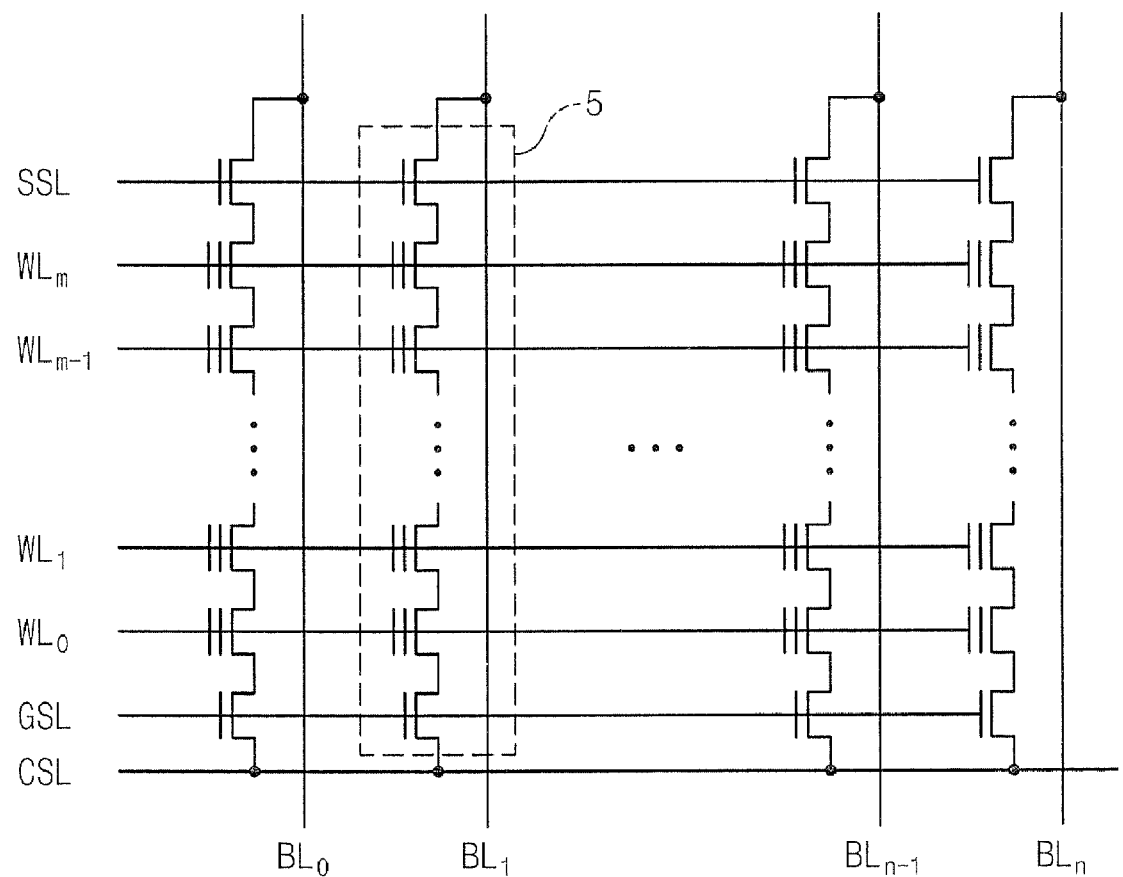
FIG. 1 is a circuit diagram illustrating a cell array structure of a conventional NAND flash memory.
Figure 2:
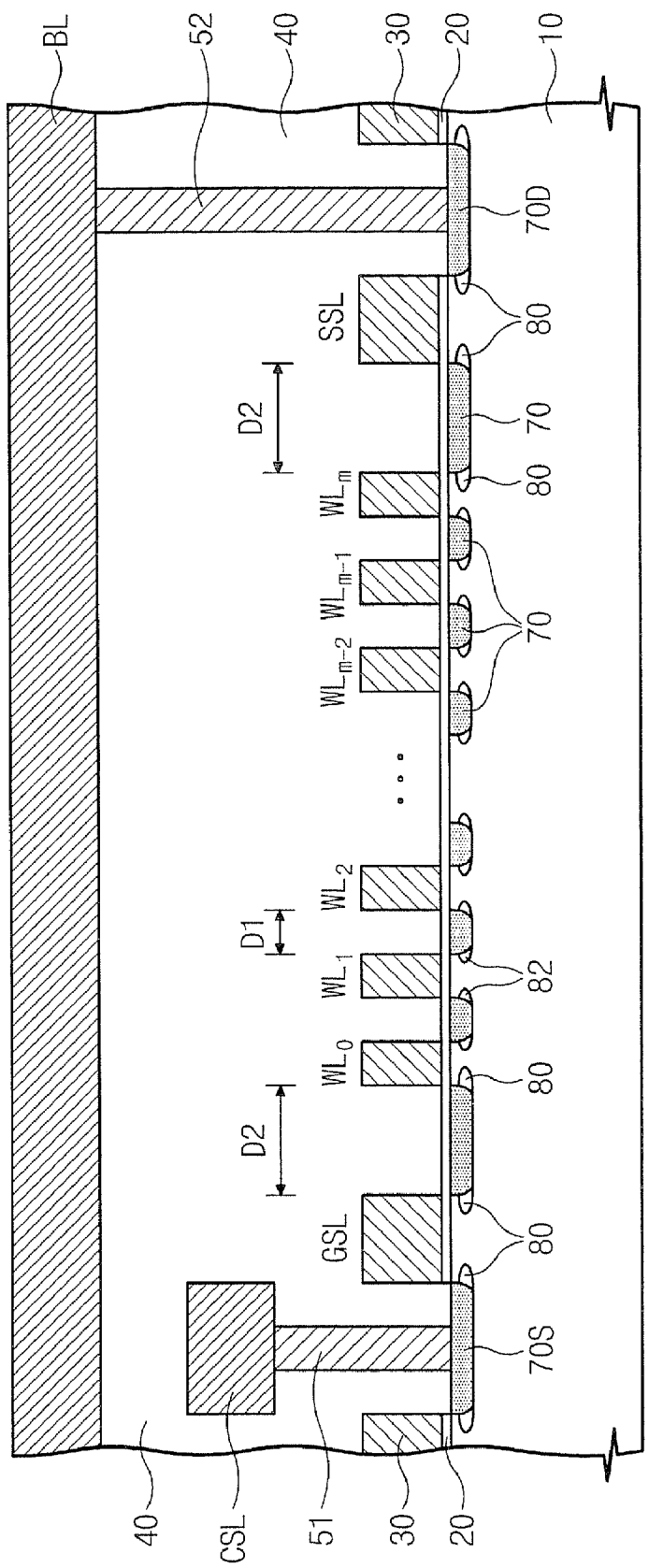
FIG. 2 is a cross-sectional view illustrating a portion of a cell array of a conventional charge trap type NAND flash memory.
Figure 3:
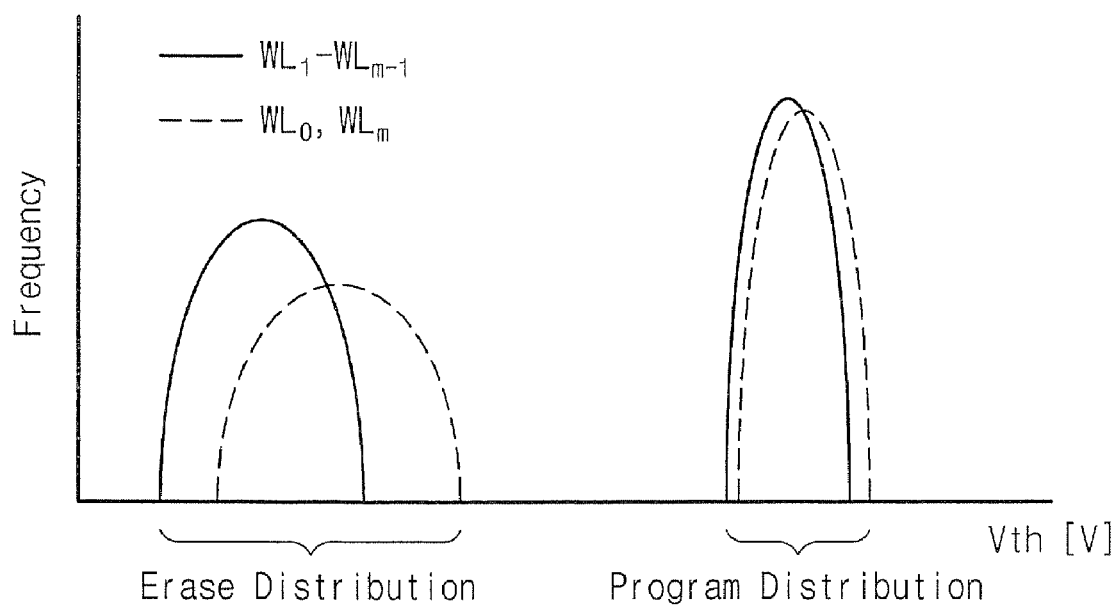
FIG. 3 is a graph illustrating a difference in erasing characteristics according to positions of word lines in the conventional NAND flash memory.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 4:
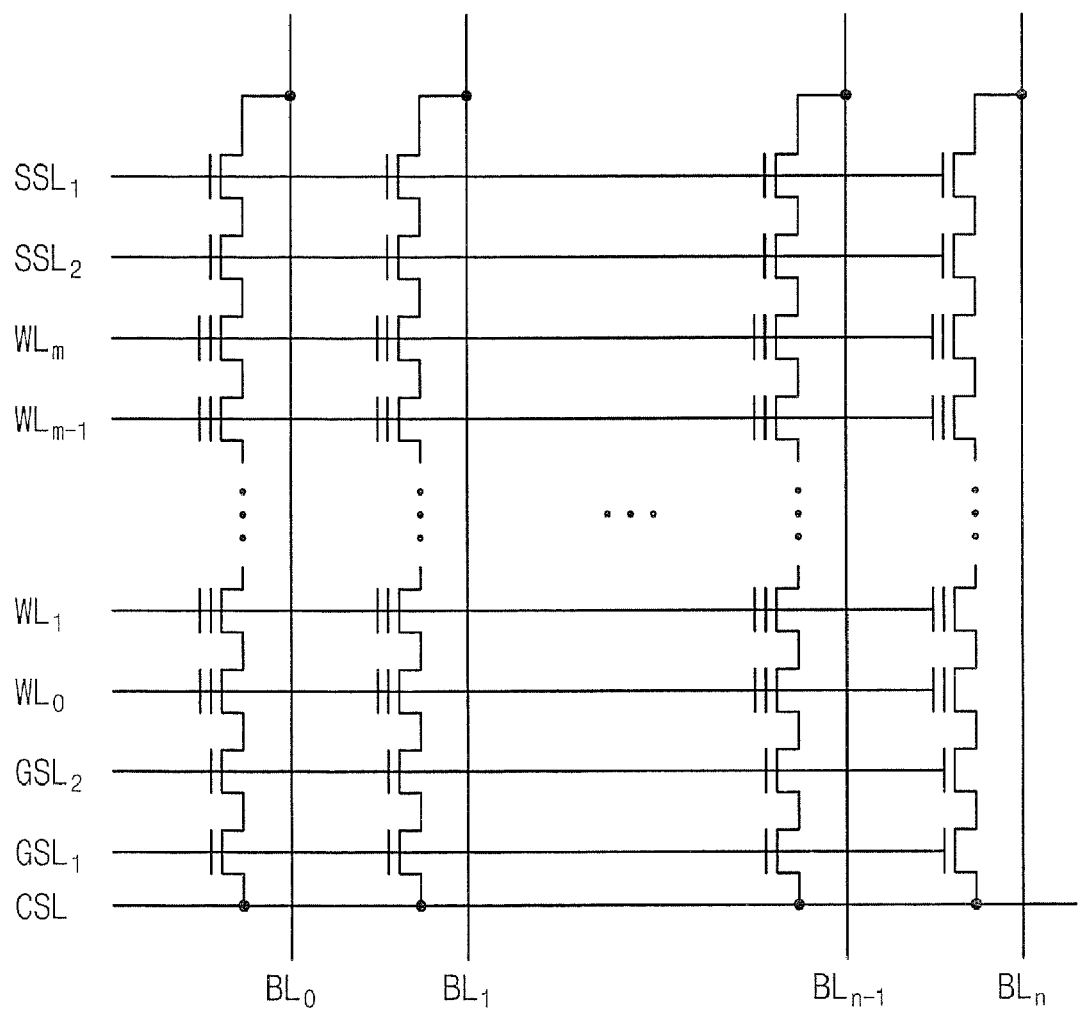
FIG. 4 is a circuit diagram illustrating a cell array structure of a NAND flash memory according to some embodiments of the present invention.
Figure 5:
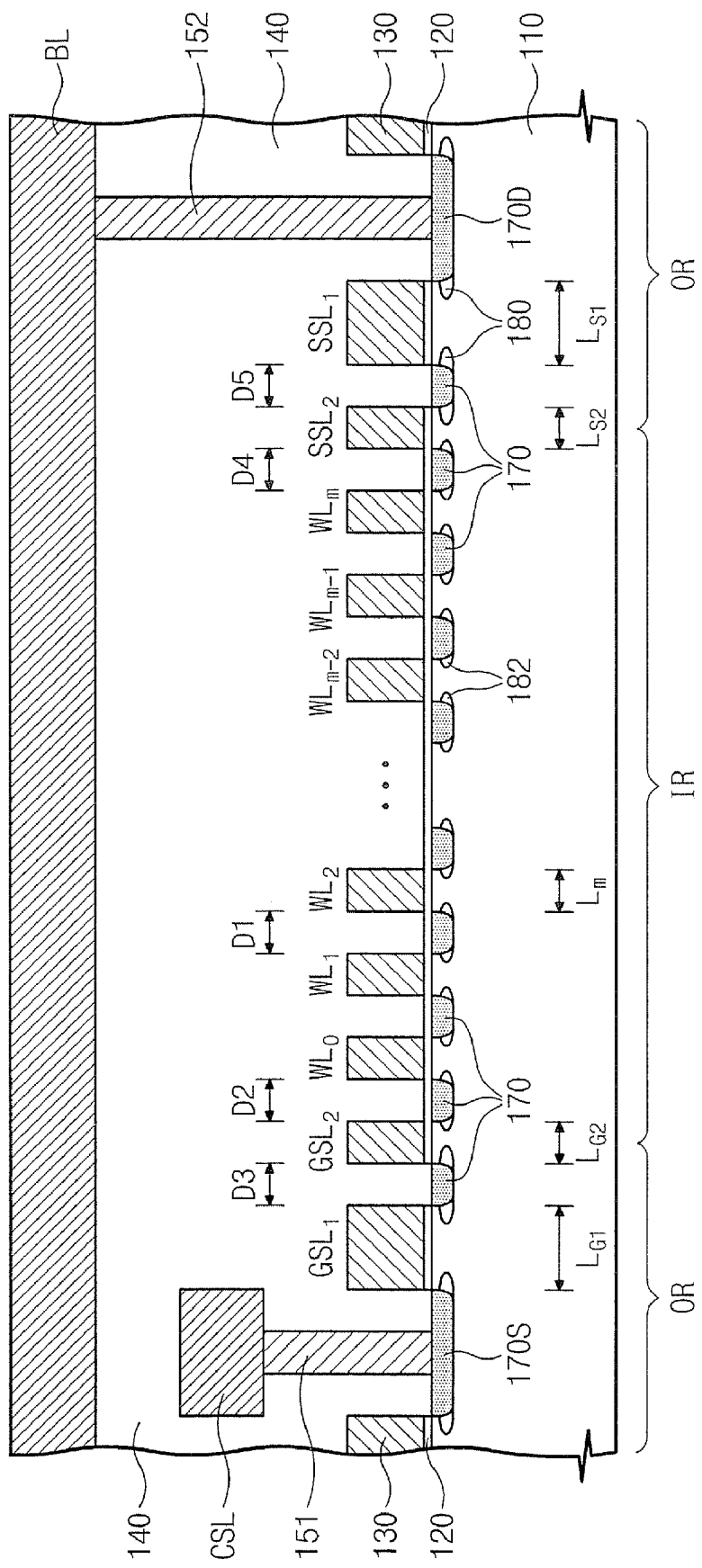
FIG. 5 is a cross-sectional view illustrating a portion of a cell array of a charge trap type NAND flash memory according to some embodiments of the present invention.

FIG. 4 is a circuit diagram illustrating a cell array structure of a NAND flash memory according to some embodiments of the present invention, and FIG. 5 is a cross-sectional view illustrating a portion of a cell array of a charge trap type NAND flash memory according to one embodiment of the present invention.

Referring to FIGS. 4 and 5, a cell array of a charge trap type NAND flash memory according to some embodiments of the present invention is formed on a semiconductor substrate 110 having an inner region IR and an outer region OR. In more detail, device isolation patterns are disposed on a predetermined region of the semiconductor substrate 110 so as to define active regions, and gates 130 are disposed over the device isolation patterns such that they cross over the active regions.

As shown in FIG. 5, the gates 130 include a plurality of word lines $WL_0$~$WL_m$ (also referred to herein as storage gate patterns and/or memory cell gate patterns) used for gate electrodes of memory cell transistors, two string selection lines $SSL_1$ and $SSL_2$ used for gate electrodes of string selection transistors, and two ground selection lines $GSL_1$ and $GSL_2$ used for gate electrodes of ground selection transistors. The string selection lines $SSL_1$ and $SSL_2$ and the ground selection lines $GSL_1$ and $GSL_2$ may also be generally referred to herein as select gate patterns. The number of word lines may be 32; however, 8, 16, 24 or 128 word lines may be provided according to circumstances. The word lines $WL_0$~$WL_m$ constitute a memory gate structure, and the string and ground selection lines $SSL_1$, $SSL_2$, $GSL_1$ and $GSL_2$ constitute a select gate structure.

Here, the memory gate structure, i.e., the word lines $WL_0$~$WL_m$, is disposed in the inner region IR. On the contrary, the select gate structure, i.e., the string and ground selection lines $SSL_1$, $SSL_2$, $GSL_1$ and $GSL_2$, is disposed on an interface between the inner region IR and the outer region OR as well as the outer region OR. That is, the string selection line $SSL_2$ immediately adjacent to the memory gate structure (hereinafter referred to as an inner string selection line $SSL_2$) and the ground selection line $GSL_2$ immediately adjacent to the memory gate structure (hereinafter referred to as an inner ground selection line $GSL_2$) are disposed on the interfaces between the outer region OR and the inner region IR, respectively, as illustrated in FIG. 5.

Impurity regions 170 are disposed in the active region between the gates 130, wherein the impurity regions 170 are used for source/drain electrodes of the memory transistors and the string/ground selection transistors. In order to use the impurity regions 170 as the electrodes, the impurity regions 170 have different conductivity types than the semiconductor substrate 110.

Still referring to FIG. 5, an outer halo region 180 is formed around the lower portion of the impurity region 170 in the outer region OR, and an inner halo region 182 is formed around the lower portion of the impurity region 170 in the inner region IR. At this time, the outer and inner halo regions 180 and 182 are formed through ion implantation process, of which conductivity types are different from the impurity regions 170. To this end, the ion implantation process is performed using atoms having the same conductivity types as the semiconductor substrate 110, e.g., boron atoms, as impurity atoms. Herein, a voltage condition to suppress a short channel effect may be about 8 V in case of the string selection transistor, but may be about 0.8 V in case of the memory transistors. In consideration of this difference, the outer halo region 180 may have a higher impurity concentration than the inner halo region 182.

In an ion implantation process in NAND flash memory devices, the impurity concentration in the portions of the active region between gates may be higher in cases where there are wider spaces between gates than in cases where there are narrower spaces. By using this phenomenon, it may be possible to form a structure in which the impurity concentration is higher in the outer halo region 180 than in the inner halo region 182. In detail, as shown in FIG. 5, a space D5 between the inner string selection line $SSL_2$ and the adjacent string selection line $SSL_1$ is wider than a space D4 between the inner string selection line $SSL_2$ and the adjacent word line $WL_m$, and a space D3 between the inner ground selection line $GSL_2$ and the adjacent ground selection line $GSL_1$ is also wider than a space D2 between the inner ground selection line $GSL_2$ and the adjacent word line $WL_0$. That is, D3 should be greater than D2, and D5 should be greater than D4.

Furthermore, in order to prevent variations in the operational characteristics of the outermost word lines $WL_0$ and $WL_m$ due to the differences in the impurity concentrations, which has been discussed above as a problem in conventional NAND flash memory devices, the impurity regions 170 and the inner halo regions 182 formed at both sides of the outermost word lines $WL_0$ and $WL_m$ should be substantially equal and/or symmetrical to each other. Herein, "substantially equal" means that differences due to process variations may be negligible if within an allowable error range. Accordingly, the memory transistors formed in the internal region IR have junction structures that are substantially equal to one another.

In order to enhance the uniformity of the operational characteristics between the outermost word lines $WL_0$ and $WL_m$ and the word lines $WL_1$~$WL_{m-1}$ disposed therebetween, respective intra-distances D1 between the word lines $WL_0$~$WL_m$ should be substantially equal to one another, and further substantially equal to both the space D2 between the inner ground selection line $GSL_2$ and the adjacent word line $WL_0$ and the space D4 between the inner string selection line $SSL_2$ and the adjacent word line $WL_m$. In virtue of such a structure, the cell array of the NAND flash memory according to some embodiments of the present invention provides a relatively uniform distribution of threshold voltages for programmed/erased cells regardless of the relative positions of the word lines.

In addition, the string selection lines $SSL_1$ and $SSL_2$ and the ground selection lines $GSL_1$ and $GSL_2$ may have the linewidths equal to or greater than the linewidth $L_m$ of each word line $WL_0$~$WL_m$. In detail, it is preferable that the inner string selection line $SSL_2$ and the inner ground selection line $GSL_2$ have the linewidths $L_{S2}$ and $L_{G2}$, respectively, which are equal to or greater than the linewidth $L_m$ of each word line $WL_0$~$WL_m$, and the outermost selection lines, i.e., $SSL_1$ and $GSL_1$, have linewidths $L_{S1}$ and $L_{G1}$, respectively, which are greater than the linewidth $L_m$ of each word line $WL_0$~$WL_m$.

An interlayer insulating layer 140 covering the gates 130 is disposed on the semiconductor substrate 110. A common source line CSL parallel to the gates 130 is disposed in the interlayer insulating layer 140. The common source line CSL is connected to an impurity region 170S (hereinafter referred to as a source region) at one side of the ground selection line $GSL_1$ through first plugs 151 penetrating the interlayer insulating layer 140.

Bit lines $BL_0$~$BL_n$ are disposed on the interlayer insulating layer 140 such that they cross over the gates 130. The bit lines $BL_0$~$BL_n$ are connected to impurity regions 170D (hereinafter referred to as a drain region) at one side of the string selection line $SSL_1$ through second plugs 152 penetrating the interlayer insulating layer 140. Resultingly, the memory transistors and the select transistors are connected to the bit line BL and the common source line CSL in series.

Charge-storing patterns 120 are disposed under the gates 130. The charge-storing patterns 120 are not only used as the gate insulating layers of the memory transistors, the string selection transistors and the ground selection transistors, but also as a thin film for data storage. To this end, the charge-storing pattern 120 may include a silicon nitride layer or a silicon oxynitride layer having sufficient trap sites therein. In addition, the charge-storing pattern 120 may further include a silicon oxide layer. For example, the charge-storing pattern 120 may be formed of the silicon oxide layer, the silicon nitride layer and the silicon oxide layer which are stacked in sequence.

According to some embodiments of the present invention, the charge-storing pattern 120 is formed such that it covers the surface of the active region of the inner region IR. In contrast, in the outer region OR, the charge-storing pattern 120 has openings which expose portions of the active regions between the string selection lines $SSL_1$ and $SSL_2$ and between the ground selection lines $GSL_1$ and $GSL_2$, as illustrated in the drawings.

As described above, since the inner string selection line $SSL_2$ and the inner ground selection line $GSL_2$ are formed on the interface between the inner region IR and the outer region OR, the openings are not formed in the inner region IR but formed in only the outer region OR. This structure of the charge-storing pattern 120 may be used for differentiating the impurity concentrations of the outer and inner halo regions 180 and 182 from each other. That is, the outer halo regions 180 may be formed in the active regions between the string selection lines $SSL_1$ and $SSL_2$ and between the ground selection lines $GSL_1$ and $GSL_2$, which are uncovered by the charge-storing pattern 120. In detail, when an ion energy for an ion implantation process is suitably selected, the concentration of the implanted impurity regions may be varied based on whether or not the charge-storing pattern 120 is present. As a result, the outer halo region 180 may have higher impurity concentration than the inner halo region 182, as mentioned above.

Figure 6:
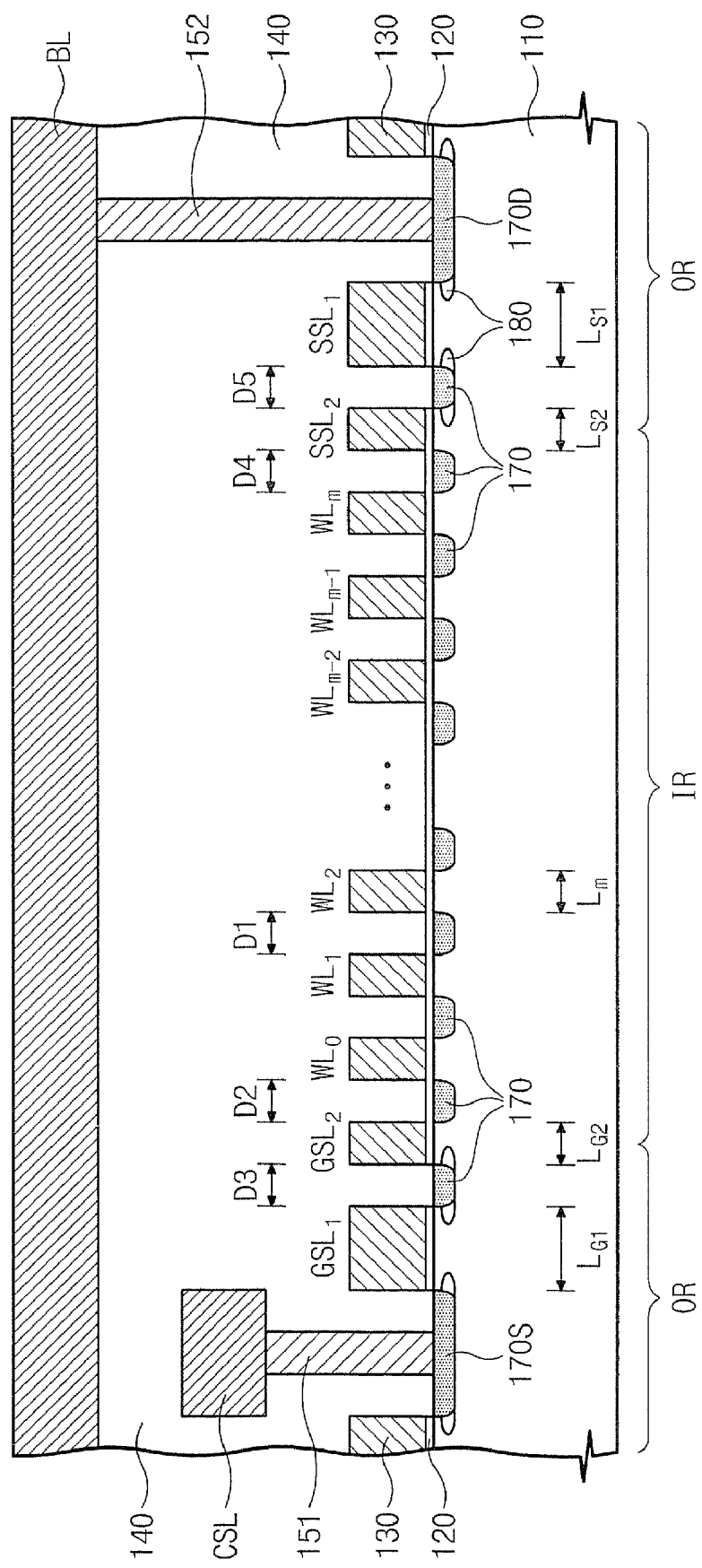
FIG. 6 is a cross-sectional view illustrating a portion of a cell array of a charge trap type NAND flash memory according to further embodiments of the present invention.

Meanwhile, according to further embodiments of the present invention, the inner halo regions 182 may not be formed (see FIG. 6). To this end, there may be employed a method of using a photoresist pattern (not shown) as an ion mask when performing the ion implantation process for forming the halo region, wherein the photoresist pattern covers the inner region IR but exposes the outer region OR. In this case, it is possible to easily make the impurity concentration of the outer halo region 180 be greater than that of the inner halo region 182.

Figure 10:
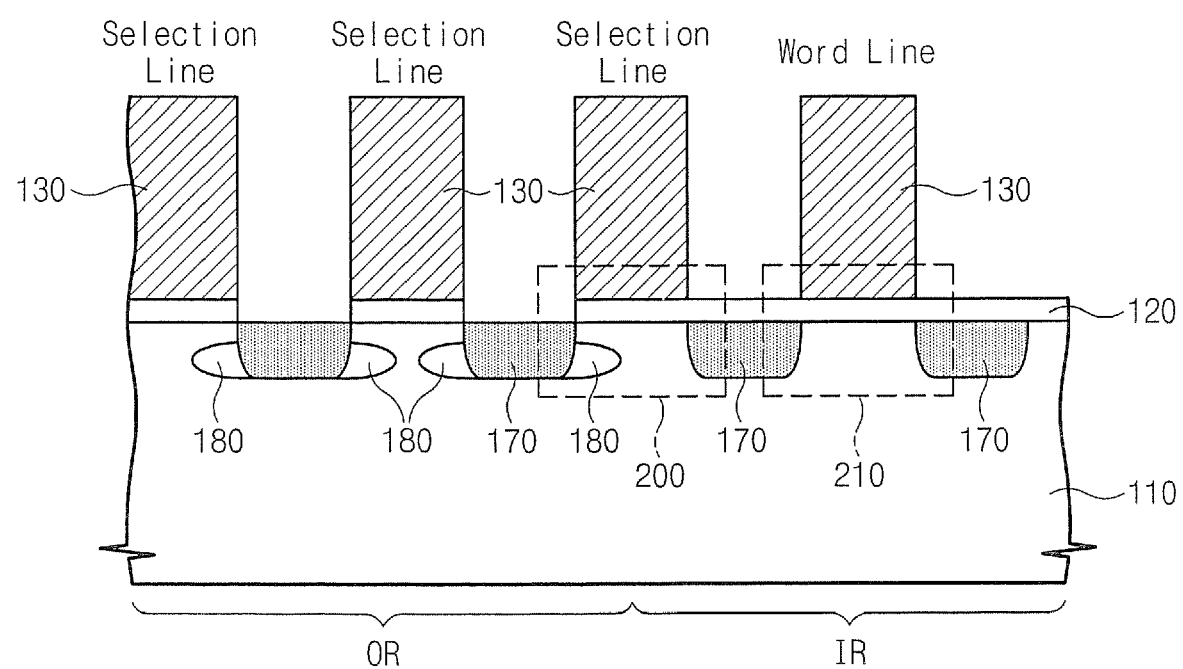
FIG. 10 is a cross-sectional view illustrating a junction structure of a cell array of a charge trap type NAND flash memory according to some embodiments of the present invention.

According to the embodiments described above, the selection lines which are immediately adjacent to the memory gate structure, i.e., the inner string selection line $SSL_2$ and the inner ground selection line $GSL_2$, are formed on the interface between the inner region IR and the outer region OR. Thus, between the outer halo region 180 formed in the outer region OR and the inner halo region 182 formed in the inner region IR, there may be a difference in the impurity concentrations (and/or a difference of whether or not there are impurities thereon). Therefore, referring to FIG. 10, the active regions at both sides of these lines $SSL_2$ and $GSL_2$ have asymmetric impurity concentration distribution (see reference numeral 200). However, the active regions at both sides of the outermost word lines $WL_0$ and $WL_m$ have symmetric impurity concentration distribution (see reference numeral 210 of FIG. 10).

Figure 7:
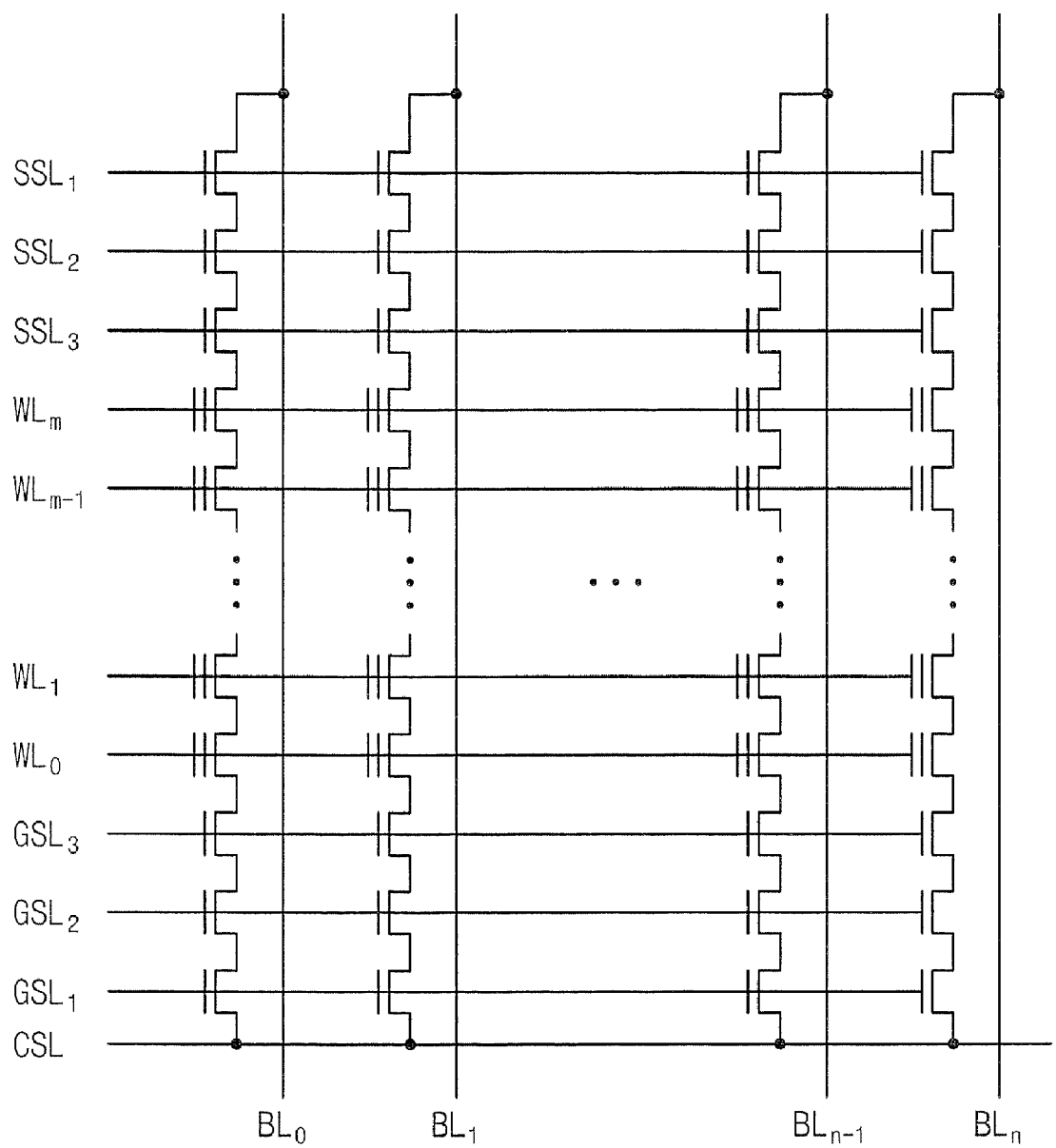
FIG. 7 is a circuit diagram illustrating a cell array structure of a NAND flash memory according to other embodiments of the present invention.
Figure 8:
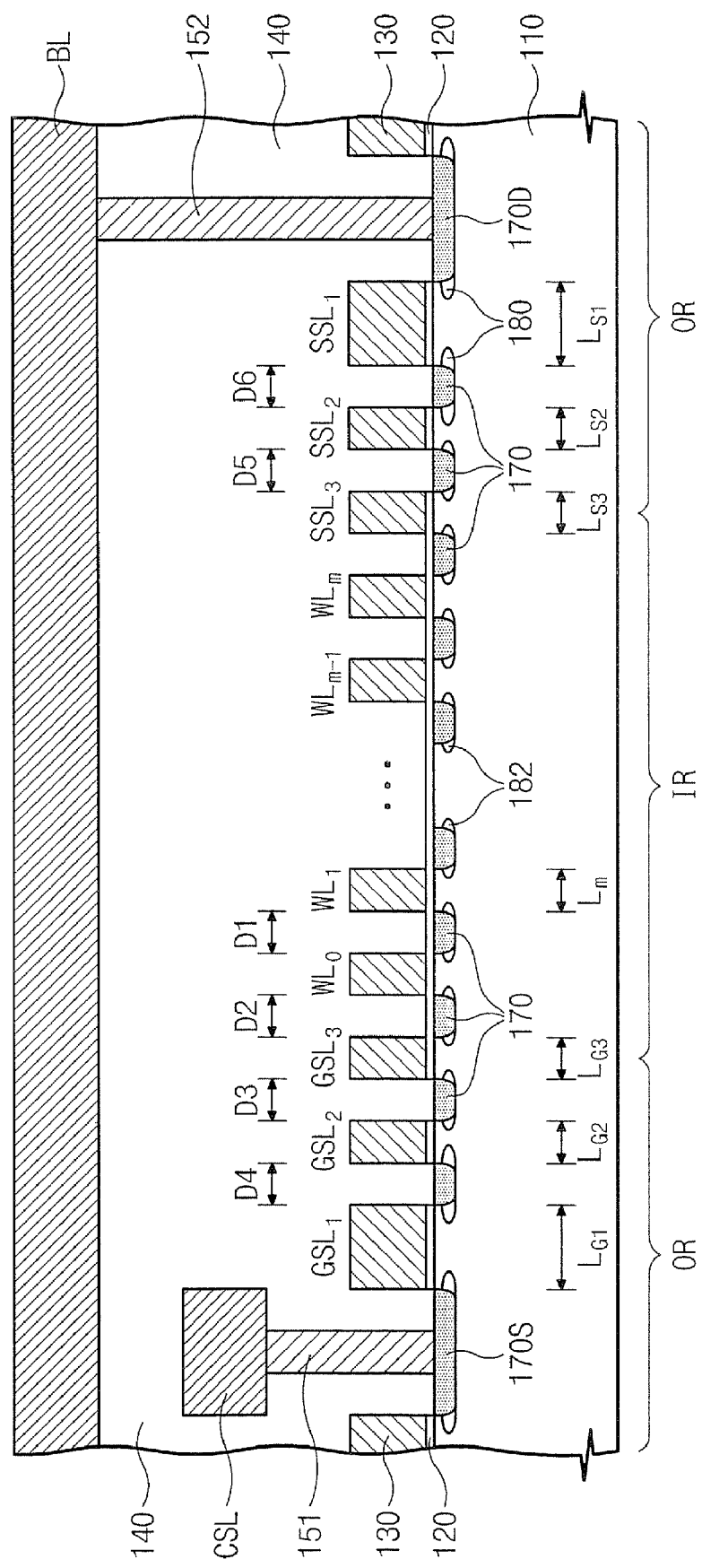
FIG. 8 is a cross-sectional view illustrating a portion of a cell array of a charge trap type NAND flash memory according to other embodiments of the present invention.

FIG. 7 is a circuit diagram illustrating a cell array structure of a NAND flash memory according to other embodiments of the present invention, and FIG. 8 is a cross-sectional view illustrating a portion of a cell array of a charge trap type NAND flash memory according to other embodiments of the present invention.

Referring to FIGS. 7 and 8, an inner string selection line $SSL_3$, an intermediate string selection line $SSL_2$ and an outer string selection line $SSL_1$ are sequentially disposed at one side of the memory gate structure (illustrated in the foregoing embodiments), and an inner ground selection line $GSL_3$, an intermediate ground selection line $GSL_2$ and an outer ground selection line $GSL_1$ are sequentially disposed at the other side of the memory gate structure. Herein, the inner string selection line $SSL_3$ and the inner ground selection line $GSL_3$ are disposed on the interfaces between the outer region OR and the inner region IR, respectively.

Resultantly, according to the cell array structure of this embodiment, the number of the string selection lines and the number of ground selection lines are 3, respectively. When the linewidths of the word lines $WL_0$~$WL_m$ and inner selection lines $GSL_3$ are reduced to 50 nm or smaller, this inventive structure may be adopted for stable operation of the device. Particularly, this structure may be employed to reduce a detrimental effect due to gate induced drain leakage (GIDL).

According to some embodiments of the present invention, each number of the string selection line and the ground selection line may be 3 or more, and further, the number of the string selection line may be different from the number of the ground selection line.

As shown in FIG. 8, a space D5 between the intermediate string selection line $SSL_2$ and the inner string selection line $SSL_3$ is substantially equal to a space D6 between the intermediate string selection line $SSL_2$ and the outer string selection line $SSL_1$. In addition, these spaces D5 and D6 may be substantially equal to intra-distances D1 between the word lines $WL_0$~$WL_m$. However, in some embodiments, these spaces D5 and D6 may be greater than D1. Likewise, a space D3 between the intermediate ground selection line $GSL_2$ and the inner ground selection line $GSL_3$ is substantially equal to a space D4 between the intermediate ground selection line $GSL_2$ and the outer ground selection line $GSL_1$. In addition, these spaces D3 and D4 may be greater than or substantially equal to the intra-distances D1 between the word lines $WL_0$~$WL_m$.

In addition, the string selection lines $SSL_1$~$SSL_3$ and the ground selection lines $GSL_1$~$GSL_3$ may have the linewidths equal to or greater than the linewidth $L_m$ of each word line $WL_0$~$WL_m$. In detail, the linewidths $L_{S2}$ and $L_{S3}$ of the inner/intermediate string selection lines $SSL_2$ and $SSL_3$ and the linewidths $L_{G2}$ and $L_{G3}$ of the inner/intermediate ground selection lines $GSL_2$ and $GSL_3$ may be greater than or equal to the linewidth $L_m$ of each word line $WL_0$~$WL_m$. The linewidths $L_{S1}$ and $L_{G1}$ of the outer selection lines $SSL_1$ and $GSL_1$ may be greater than the linewidth $L_m$ of each word line $WL_0$~$WL_m$.

Except for the difference of the number of the selection lines as described above, the embodiment of FIG. 8 is similar to the foregoing embodiments illustrated with reference to FIGS. 5 and 6. That is, the outer halo region 180 is locally disposed in the outer region OR, and the inner halo region 182 is locally disposed in the inner region IR. As a result, referring to FIG. 10, the active regions at both sides of the inner string selection line $SSL_3$ and the inner ground selection line $GSL_3$ have asymmetric impurity concentration distributions (see reference numeral 200), whereas the active regions at both sides of the outermost word lines $WL_0$ and $WL_m$ have symmetric impurity concentration distributions (see reference numeral 210). For the sake of conciseness, the descriptions which have been set forth in the foregoing embodiments will be omitted herein.

Figure 9:
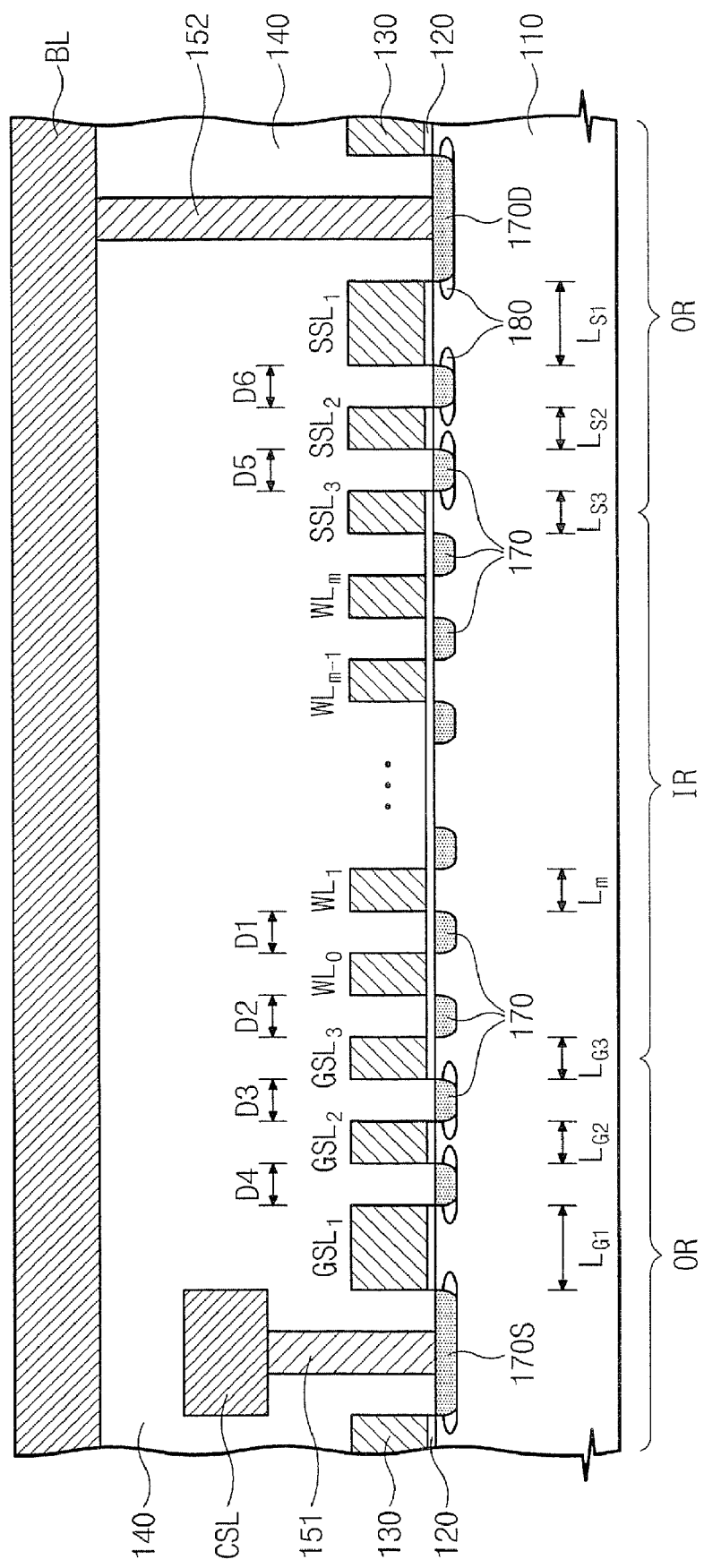
FIG. 9 is a cross-sectional view illustrating a portion of a cell array of a charge trap type NAND flash memory according to still other embodiments of the present invention.

Meanwhile, the embodiments having three selection lines may be modified to provide other embodiments in which the inner halo regions 182 are not formed, as shown in FIG. 9. To this end, like the foregoing embodiments, a photoresist pattern (not shown) may be used as an ion mask, where the photoresist pattern covers the inner region IR but exposes the outer region OR, in the ion implantation process for forming the halo region. In this case, it may be possible to form the impurity concentration of the outer halo region 180 to be greater than the inner halo region 182.

FIGS. 11 through 14 are cross-sectional views illustrating a portion of a cell array of a floating gate type NAND flash memory according to other embodiments of the present invention. In detail, these embodiments relate to a floating gate type NAND flash memory, which is different from the aforementioned embodiments of the charge trap type NAND flash memory. Except differences of the kind of structure for storing data and the gate structure, these embodiments are similar to the foregoing embodiments so that similar descriptions will be omitted herein.

Referring to FIGS. 11 through 14, gates 130 crossing over the active regions are formed on a semiconductor substrate 110 having an inner region IR and an outer region OR. Like the foregoing embodiments, the gates 130 are used for word lines $WL_0 \sim WL_m$ (or memory gates), string selection lines and ground selection lines. The word lines are used for gate electrodes of the memory transistors, and the string and ground selection lines are used for gate electrodes of the string and ground selection transistors, respectively. Here, the word lines $WL_0 \sim WL_m$ constitute a memory gate structure, and the string and ground selection lines constitute a select gate structure.

Figure 11:
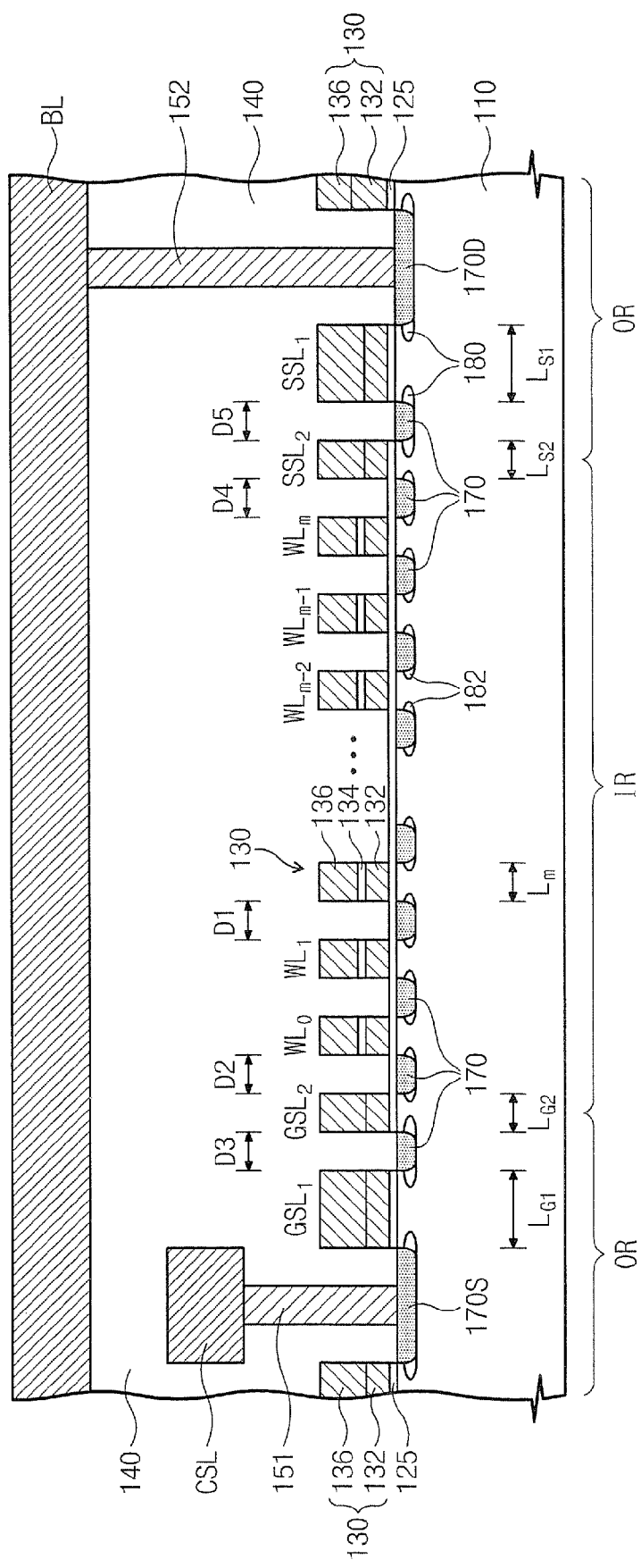
FIGS. 11 through 14 are cross-sectional views illustrating a portion of a cell array of a floating gate type NAND flash memory according to some embodiments of the present invention.
Figure 12:
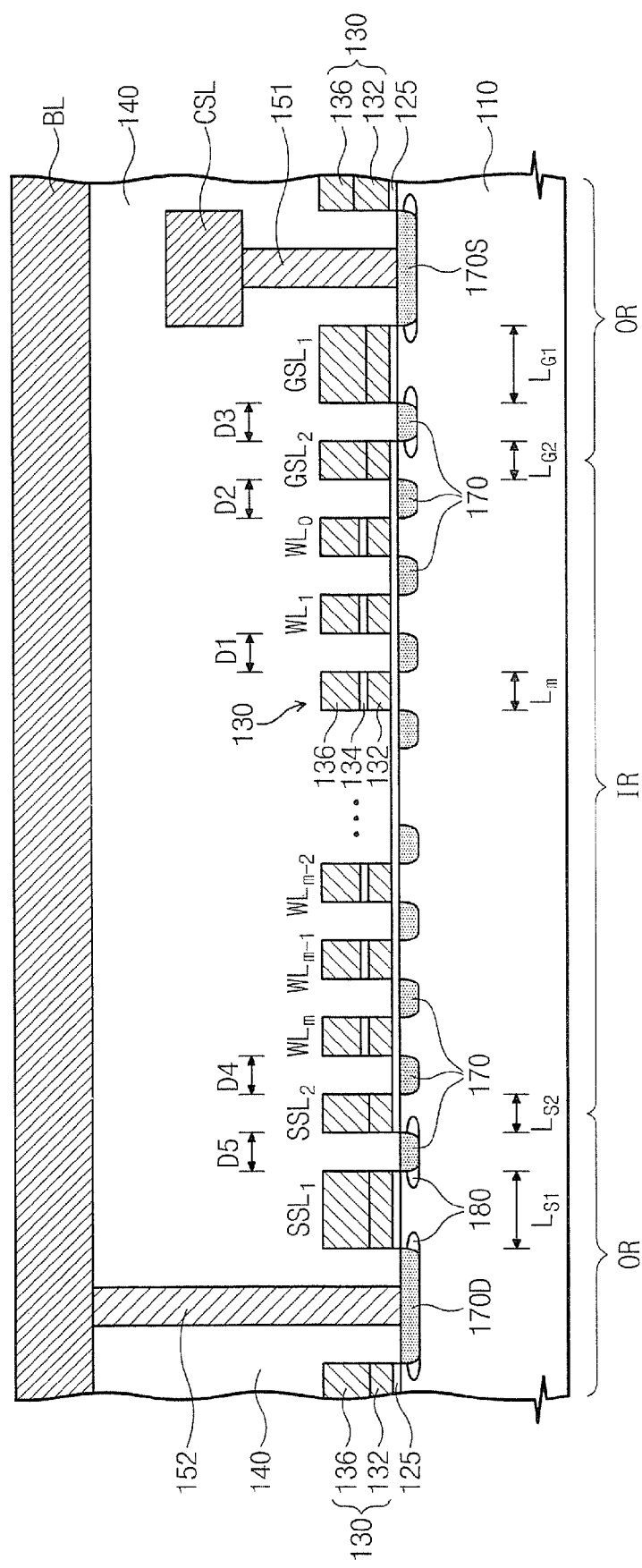
Figure 13:
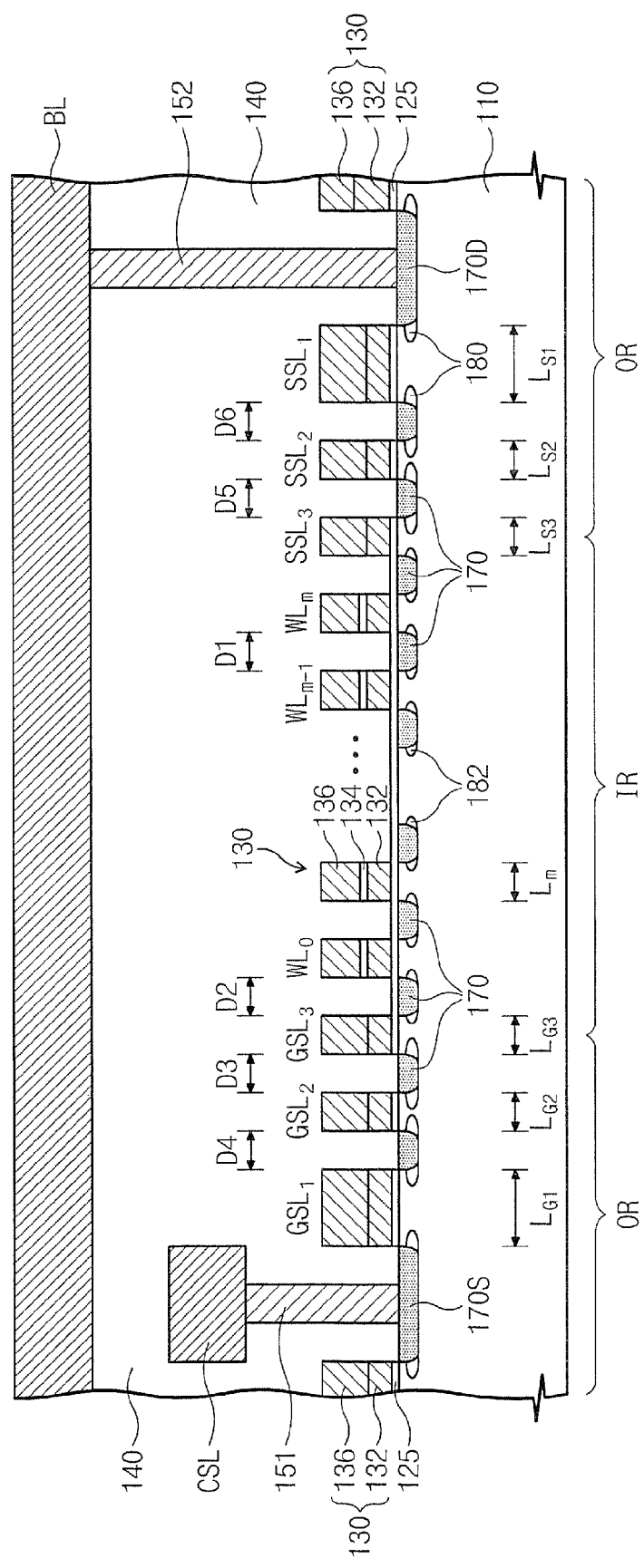
Figure 14:
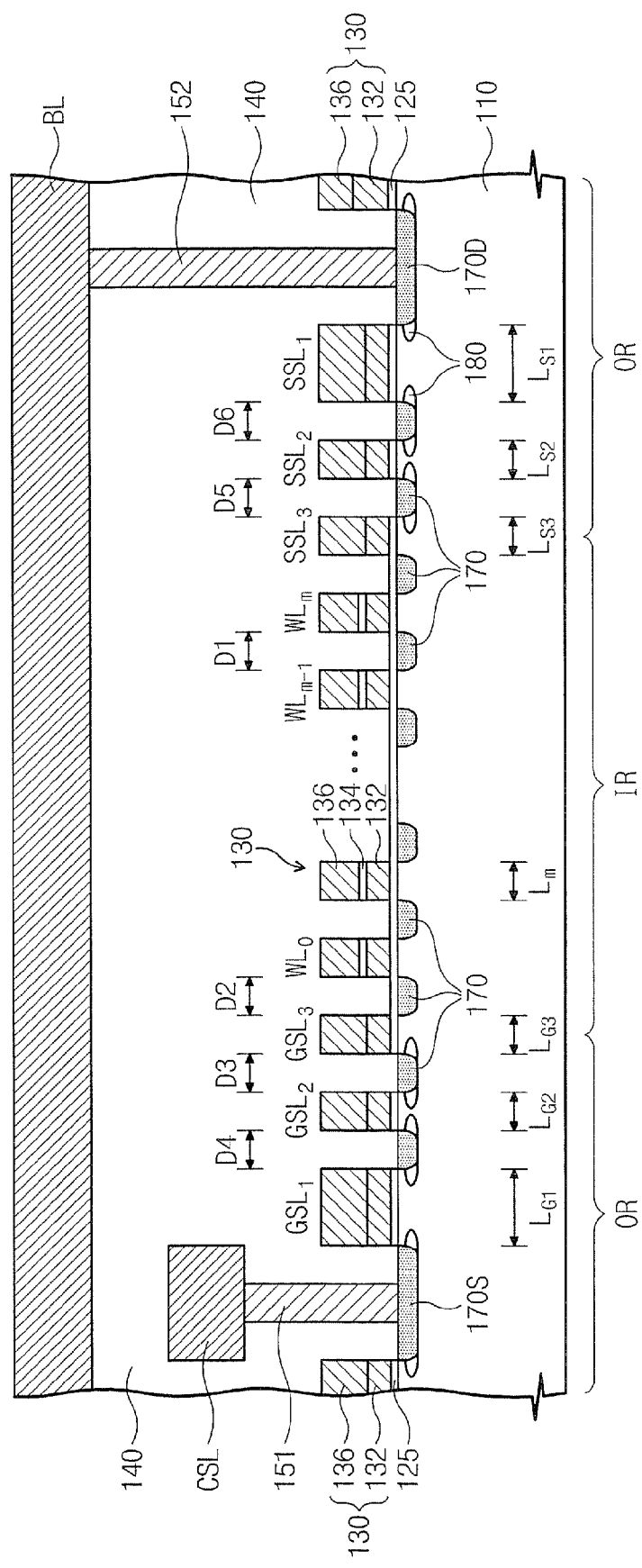

According to some embodiments of the present invention, although the number of the word lines, i.e., m+1, may be 32, it may be 8, 16, 64 or 128 according to circumstances. Furthermore, the number of the string and ground selection lines may be 2 as illustrated in FIGS. 11 and 12, or it may be 3 as illustrated in FIGS. 13 and 14. According to other embodiments of the present invention, the numbers of the string and ground selection lines may be different from each other, and they may be 3 or more. Likewise, the string selection line ($SSL_2$ of FIGS. 11 and 12, and $SSL_3$ of FIGS. 13 and 14) adjacent to the outermost word line $WL_0$, and the ground selection line ($GSL_2$ of FIGS. 11 and 12, and $GSL_3$ of FIGS. 13 and 14) adjacent to the outermost word line $WL_m$, are disposed on the interfaces between the outer region OR and the internal region IR, respectively.

The gate 130 includes a lower gate electrode 132 and an upper gate electrode 136, which are stacked in sequence. In case of the word lines $WL_0 \sim WL_m$, the lower gate electrode 132 is used for a floating gate electrode in which data are stored, and the upper gate electrode 134 is used for a control gate electrode to which a gate voltage is applied from an external circuit. In addition, in case of the word lines $WL_0 \sim WL_m$, a gate interlayer insulating pattern 134 is interposed between the lower and upper gate electrodes 132 and 136 for electrically isolating the lower gate electrode 132. The gate interlayer insulating pattern 134 may be configured with a silicon oxide layer, a silicon nitride layer and a silicon oxide layer, which are stacked in sequence. The lower gate electrode 132 may be formed of polycrystalline silicon layer, and the upper gate electrode 136 may be configured with polycrystalline silicon layer and a metallic conductive layer such as silicide, which are stacked in sequence.

Between the gate 130 and the active region, a gate insulating pattern 125 is interposed. Since the embodiments relate to the floating gate type flash memory, it is preferable that the gate insulating pattern 125 is formed of silicon oxide. In a layout, the gate insulating pattern 125 may be disposed like the charge-storing pattern 120 of the foregoing embodiments. That is, the gate insulating pattern 125 is extended from the lower portion of the word line $WL_0 \sim WL_m$ to cover the entire top surface of the active region of the inner region IR. However, the gate insulating pattern 125 exposes the top surfaces of the active regions between the string selection lines and between the ground selection lines.

There are formed junction regions on the active region between the gates 130. According to the embodiments, the junction regions formed in the inner region IR have substantially similar structures regardless of the position of the word line (see reference numeral 210 of FIG. 15). The substantial similarity of each junction region formed in the inner region IR is a technical characteristic of some embodiments of the present invention.

An outer halo region 180 having the same conductivity type as the semiconductor substrate 110 may be formed on the active region between the gates 130 of the outer region OR. In virtue of the existence of the outer halo region 180, the respective junction regions formed in the outer and inner halo regions OR and IR may have different structures and/or impurity concentration distributions. According to other embodiments of the present invention, an inner halo region 182 having the same conductivity type as the outer halo region 180 may be formed in the active region between the gates 130 of the inner region IR, as illustrated in FIGS. 13 and 14. However, the inner halo region 182 has a lower impurity concentration than the outer halo region 180.

Figure 15:
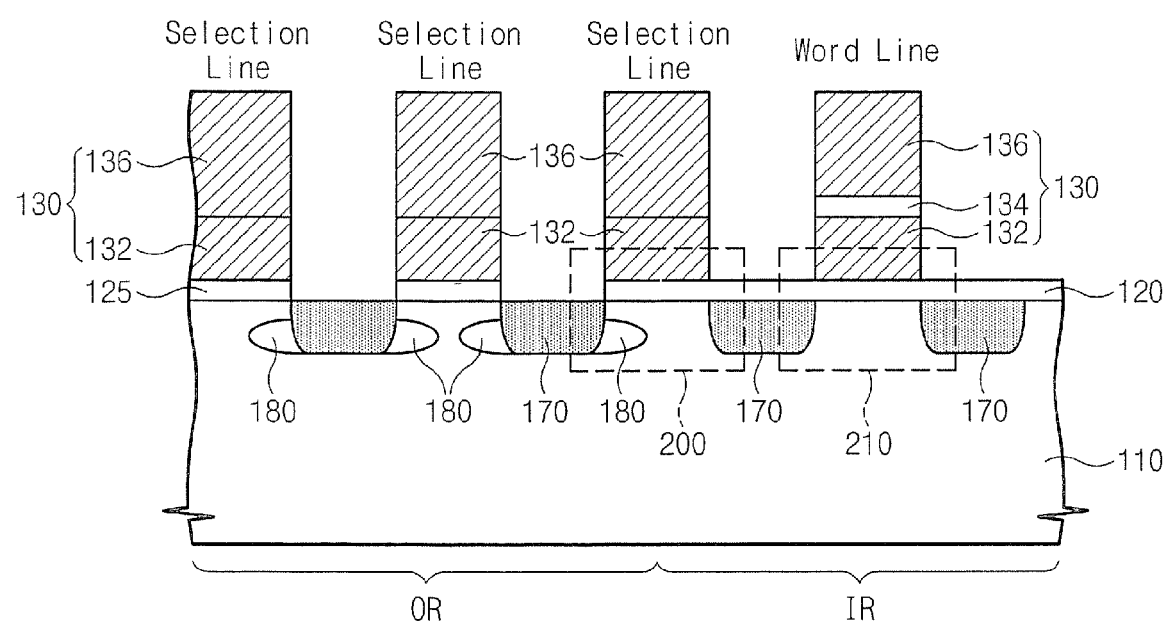
FIG. 15 is a cross-sectional view illustrating a junction structure of a cell array of a floating gate type NAND flash memory according to some embodiments of the present invention.

Considering that the string and ground selection lines adjacent to the word line are disposed on the interface between the outer region OR and the inner region IR, the junction regions formed at both sides of the selection lines have asymmetric impurity concentration structures and/or distributions (see 200 of FIG. 15). Resultantly, according to some embodiments of the present invention, the memory cell transistors and the select transistors have different structures for the junction regions. Nevertheless, the memory cell transistors formed in the inner region IR have substantially similar structures from a perspective of the structure of the junction region and/or the distances between the memory cell gates (see reference numeral 210 of FIG. 15).

According to some embodiments of the present invention, a plurality of string/ground selection lines are disposed at both sides of the word lines. As such, the impurity concentration distributions of the junction regions of the memory cell transistors are substantially similar, regardless of the relative positions of the word line in a NAND-type memory structure. Accordingly, in comparison with the prior art, the operational characteristics of the outermost memory cell transistors may be substantially similar as that of the inner memory cell transistors in NAND flash memory devices according to some embodiments of the present invention.

While the present invention has been particularly shown and described with reference to preferred embodiments thereof, it will be understood by those skilled in the art that various changes in form and details may be made therein without departing from the spirit and scope of the invention as defined by the appended claims.

That which is claimed:

1. A cell array structure of a NAND flash memory, comprising:
   a semiconductor substrate including an active region therein and having an inner region and an outer region;
   a memory gate structure including a plurality of word lines crossing over the active region, the memory gate structure being disposed on the inner region;
   a select gate structure crossing over the active region, wherein the select gate structure comprises a plurality of string selection lines and a plurality of ground selection lines respectively disposed on opposite sides of the memory gate structure, respectively; and
   impurity regions disposed in the active region between the plurality of word lines, between the plurality of string selection lines, between the plurality of ground selection lines, between one of the plurality of string selection lines and an immediately adjacent one of the plurality of word lines, and between one of the plurality of ground selection lines and an immediately adjacent one of the plurality of word lines,
   wherein the impurity regions in the inner region have different impurity concentration distributions than the impurity regions in the outer region, and wherein one of the plurality of string selection lines and one of the plurality of ground selection lines are disposed on respective interfaces between the inner region and the outer region on the opposite sides of the memory gate structure.

2. The cell array structure of the NAND flash memory of claim 1, further comprising a charge-storing pattern disposed under the memory and select gate structures to cover a predetermined region of the active region,
   wherein the charge-storing pattern covers surfaces of the active region between ones of the plurality of word lines of the inner region, but exposes portions of the active region between ones of the plurality of string selection lines and portions of the active region between ones of the plurality of ground selection lines of the outer region.

3. The cell array structure of the NAND flash memory of claim 2, wherein the charge-storing pattern is formed of at least one selected from the group consisting of a silicon nitride layer, a silicon oxynitride layer, and a silicon oxide layer.

4. The cell array structure of the NAND flash memory of claim 2, further comprising outer halo regions disposed adjacent lower portions of the impurity regions of the outer region,
   wherein the outer halo regions are formed in the portions of the active region exposed by the charge-storing pattern.

5. The cell array structure of the NAND flash memory of claim 4, wherein the impurity regions have a different conductivity type from the semiconductor substrate, and wherein the outer halo regions have a same conductivity type as the semiconductor substrate.

6. The cell array structure of the NAND flash memory of claim 4, further comprising inner halo regions disposed around lower portions of the impurity regions of the inner region,
   wherein the inner halo regions have a same conductivity type as the outer halo regions and have lower impurity concentrations than the outer halo regions.

7. The cell array structure of the NAND flash memory of claim 4, wherein the outer halo regions are locally formed in the outer region so that the active regions at either side of each of the string and ground selection lines disposed on the interface between the inner region and the outer region have asymmetric impurity concentration distributions.

8. The cell array structure of the NAND flash memory of claim 1, wherein the string selection lines comprise:
   an outer string selection line disposed at one side of the memory gate structure; and
   an inner string selection line disposed between the outer string selection line and the memory gate structure,
   wherein the ground selection lines comprise:
   an outer ground selection line disposed at the other side of the memory gate structure; and
   an inner ground selection line disposed between the outer ground selection line and the memory gate structure,
   and wherein the inner string selection line and the inner ground selection line are disposed on the interface between the inner region and the outer region, and wherein linewidths of the inner string selection line and inner ground selection line are greater than or equal to that of one of the plurality of word lines.

9. The cell array structure of the NAND flash memory of claim 8, further comprising:
   at least one intermediate string selection line disposed between the inner and outer string selection lines; and
   at least one intermediate ground selection line disposed between the inner and outer ground selection lines.

10. The cell array structure of the NAND flash memory of claim 1, wherein spaces between ones of the plurality of string selection lines, between ones of the plurality of ground selection lines, between one of the plurality of string selection lines and an immediately adjacent one of the plurality of word lines, and between one of the plurality of ground selection lines and an immediately adjacent one of the plurality of word lines, are greater than or substantially equal to a distance between ones of the plurality of word lines.

11. The cell array structure of the NAND flash memory of claim 1, further comprising:
   drain and source regions formed in the active region at one side and the other side of the memory gate structure, respectively;
   bit lines crossing over the word lines and connected to each of the drain regions; and
   a common source line crossing over the active region and connecting the source regions,
   wherein the plurality of string selection lines are disposed between the drain region and the memory gate structure, and wherein the plurality of ground selection lines are disposed between the source region and the memory gate structure.

12. The cell array structure of the NAND flash memory of claim 1, wherein each of the plurality of word lines, the plurality of string selection lines and the plurality of ground selection lines comprises:
   a lower gate electrode disposed on the active region; and
   an upper gate electrode disposed on the lower gate electrode to cross over the active region,
   wherein the plurality of word lines further comprise a gate interlayer insulating pattern disposed between the upper and lower gate electrodes to electrically isolate the lower and upper gate electrodes from each other.

13. The cell array structure of the NAND flash memory of claim 12, further comprising a gate insulating pattern disposed under the memory and select gate structures to cover a predetermined region of the active region,
   wherein the gate insulating pattern is on surfaces of the active region between adjacent ones of the plurality of word lines on the inner region of the inner region, but exposes portions of the active region between adjacent ones of the plurality of string selection lines and adjacent ones of the plurality of ground selection lines on the outer region.

14. A cell array structure of a NAND flash memory comprising:
   a semiconductor substrate including an active region therein and having an inner region and an outer region;
   a plurality of gates disposed on the inner region and the outer region of the substrate to cross over the active region;
   impurity regions in the active region between the plurality of gates;
   a gate insulating pattern disposed between the plurality of gates and the semiconductor substrate, wherein the gate insulating pattern is on surfaces of the active region between adjacent ones of the plurality of gates on the inner region and has openings exposing portions of the active region between adjacent ones of the plurality of gates on the outer region; and
   outer halo regions in the active region adjacent lower portions of ones of the impurity regions of the outer region.

15. The cell array structure of the NAND flash memory of claim 14, wherein the outer halo regions are locally formed only in the outer region and not in the inner region.

16. The cell array structure of the NAND flash memory of claim 14, further comprising inner halo regions formed around lower portions of the impurity regions of the inner region,
   wherein the inner halo regions have a same conductivity type as the outer halo region and have a lower impurity concentration than the outer halo regions.

17. The cell array structure of the NAND flash memory of claim 14, wherein the outer halo regions are locally formed adjacent the ones of the impurity regions in the portions of the active region exposed by the openings.

18. The cell array structure of the NAND flash memory of claim 14, wherein the gate insulating pattern is formed of a silicon oxide layer, a silicon nitride layer and a silicon oxide layer which are stacked in sequence.

19. The cell array structure of the NAND flash memory of claim 14, wherein the plurality of gates comprise:
   a plurality of word lines disposed in the inner region; and
   a plurality of string selection lines and a plurality of ground selection lines disposed at one side and the other side of the plurality of word lines,
   wherein ones of the pluralities of string and ground selection lines immediately adjacent to the plurality of word lines are disposed on the interface between the inner region and the outer region.

20. The cell array structure of the NAND flash memory of claim 19, wherein the string selection lines comprises:
   an outer string selection line disposed at one side of the plurality of word lines; and
   an inner string selection line disposed between the outer string selection line and one of the plurality of word lines adjacent thereto,
   wherein the ground selection lines comprises:
   an outer ground selection line disposed at the other side of the plurality of word lines; and
   an inner ground selection line disposed between the outer ground selection line and one of the plurality of word lines adjacent thereto,
   and wherein the inner string selection line and the inner ground selection line are disposed on the interface between the inner region and the outer region, and linewidths of the inner string selection line and inner ground selection line are equal to or greater than that of one of the word lines.

21. The cell array structure of the NAND flash memory of claim 20, further comprising:
   at least one intermediate string selection line disposed between the inner and outer string selection lines; and
   at least one intermediate ground selection line disposed between the inner and outer ground selection lines.

22. The cell array structure of the NAND flash memory of claim 19, wherein spaces between the plurality of string selection lines, between the plurality of ground selection lines, between the string selection line and an adjacent word line, and between the ground selection line and an adjacent word line, are substantially equal to or greater than a distance between the plurality of word lines.

23. The cell array structure of the NAND flash memory of claim 19, wherein the outer halo regions are locally formed in the outer region so that the portions of the active region at either side of each of the pluralities of string and ground selection lines disposed on the interface between the inner region and the outer region have asymmetric impurity concentration distributions.

24. The cell array structure of the NAND flash memory of claim 19, wherein each of the plurality of word lines, the plurality of string selection lines and the plurality of ground selection lines comprises:
   a lower gate electrode disposed on the active region; and
   an upper gate electrode disposed on the lower gate electrode to cross over the active region,
   wherein the plurality of word tines further comprise a gate interlayer insulating pattern disposed between the upper and lower gate electrodes to electrically isolate the lower and upper gate electrodes, which are respectively used as a floating gate electrode and a control gate electrode.

25. The cell array structure of the NAND flash memory of claim 14, further comprising:
   drain and source regions formed on the active region at one side and the other side of the plurality of gates, respectively;
   bit lines crossing over the plurality of gates and connected to each of the drain regions; and
   a common source line crossing over the active region and connecting the source regions.

26. A NAND-type non-volatile semiconductor memory device, comprising:
   a semiconductor substrate including an active region therein;
   a gate insulating layer on the active region of the substrate;
   first and second select gate structures respectively comprising a plurality of select gate patterns on the active region of the substrate; and
   a memory gate structure comprising a plurality of storage gate patterns on the active region of the substrate between the first and second select gate structures,
   wherein the gate insulating layer is on portions of the active region between adjacent ones of the plurality of storage gate patterns of the memory gate structure and includes a plurality of openings therein exposing portions of the active region between adjacent ones of the plurality of select gate patterns of the first and second select gate structures.

27. The device of claim 26, further comprising:
   a plurality of impurity regions in portions of the active region between ones of the plurality of storage gate patterns of the memory gate structure, between the ones of the plurality of select gate patterns of the first and second select gate structures, and between the memory gate structure and the first and second select gate structures; and a plurality of halo regions adjacent ones of the plurality of impurity regions in the portions of the active region exposed by the openings in the gate insulating layer between the ones of the plurality of select gate patterns of the first and second select gate structures.

28. The device of claim 27, wherein the plurality of halo regions are adjacent opposing sides of the ones of the impurity regions in the portions of the active region exposed by the openings in the gate insulating layer.

29. The device of claim 27, wherein the plurality of halo regions comprise a plurality of outer halo regions, and further comprising:

a plurality of inner halo regions adjacent ones of the plurality of impurity regions in the portions of the active region between the ones of the plurality of storage gate patterns, between the first select gate structure and the memory gate structure, and between the second select structure and the memory gate structure, wherein the plurality of outer halo regions have a greater impurity concentration than the plurality of inner halo regions.

30. The device of claim 27, wherein the plurality of halo regions have a same conductivity type as the semiconductor substrate and an opposite conductivity type as the plurality of impurity regions.

31. The device of claim 26, wherein portions of the active region immediately adjacent to outermost ones of the plurality of storage gate patterns on opposite sides thereof have substantially similar impurity concentration distributions.

32. The device of claim 26, wherein the first and second select gate structures respectively comprise an outer select gate pattern and an inner select gate pattern immediately adjacent to an outermost one of the plurality of storage gate patterns.

33. The device of claim 32, wherein portions of the active region immediately adjacent to the inner select gate pattern on opposing sides thereof have asymmetric impurity concentration distributions.

34. The device of claim 32, wherein the first and/or second select gate structures further comprise:

at least one intermediate select gate pattern between the outer select gate pattern and the inner select gate pattern.

35. The device of claim 32, wherein the inner select gate pattern has a width that is greater than or substantially equal to a width of one of the plurality of storage gate patterns, and wherein the outer select gate pattern has a width that is greater than the width of the one of the plurality of storage gate patterns.

36. The device of claim 32, wherein a distance between the outer select gate pattern and the inner select gate pattern is greater than a distance between the inner select gate pattern and the outermost one of the plurality of storage gate patterns.

37. The device of claim 36, wherein the distance between the inner select gate pattern and the outermost one of the plurality of storage gate patterns is substantially equal to a distance between ones of the plurality of storage gate patterns.

38. The device of claim 26, wherein the device comprises a charge-trapping type flash memory device, and wherein the gate insulating layer comprises a nitride layer.

39. The device of claim 26, wherein the device comprises a floating gate type flash memory device, wherein the plurality of storage gate patterns respectively comprise a floating gate pattern on the substrate and a control gate pattern on the floating gate pattern, and wherein the gate insulating layer comprises an oxide layer.

40. The cell array structure of the NAND flash memory of claim 12, wherein the plurality of string selection lines and the plurality of ground selection lines do not comprise the gate interlayer insulating pattern between the upper and lower gate electrodes.

41. The cell array structure of the NAND flash memory of claim 1, wherein portions of the active region at either side of each of the plurality of word lines have substantially similar impurity concentration distributions regardless of a position of one of the plurality of word lines.

42. The cell array structure of the NAND flash memory of claim 1, wherein two impurity regions, which are adjacent to the string selection line or the ground selection line that are disposed on an interface between the inner region and the outer region, are asymmetric.

* * * * *

UNITED STATES PATENT AND TRADEMARK OFFICE
CERTIFICATE OF CORRECTION

PATENT NO.       : 7,470,948 B2  
APPLICATION NO.  : 11/617233  
DATED            : December 30, 2008  
INVENTOR(S)      : Park et al.

It is certified that error appears in the above-identified patent and that said Letters Patent is hereby corrected as shown below:

Column 16, Claim 24, Line 31:  Please correct "word tines"  
                                To read -- word lines --

Signed and Sealed this

Twenty-fourth Day of February, 2009

JOHN DOLL  
*Acting Director of the United States Patent and Trademark Office*